(12) United States Patent
Alcouffe et al.

(10) Patent No.: US 10,802,088 B2
(45) Date of Patent: Oct. 13, 2020

(54) METHOD FOR CONTROLLING THE PRODUCTION OF A MAGNET AND ASSOCIATED DEVICE

(71) Applicant: Commissariat à l'énergie atomique et aux énergies alternatives, Paris (FR)

(72) Inventors: François Alcouffe, Grenoble (FR); Antonio Viana, Herbeys (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 382 days.

(21) Appl. No.: 15/580,805

(22) PCT Filed: Jun. 10, 2016

(86) PCT No.: PCT/EP2016/063319
§ 371 (c)(1),
(2) Date: Dec. 8, 2017

(87) PCT Pub. No.: WO2016/198614
PCT Pub. Date: Dec. 15, 2016

(65) Prior Publication Data
US 2018/0224511 A1   Aug. 9, 2018

(30) Foreign Application Priority Data

Jun. 10, 2015  (FR) .................... 15 55294

(51) Int. Cl.
*G01R 33/00* (2006.01)
*G01R 33/12* (2006.01)
*G05B 19/401* (2006.01)

(52) U.S. Cl.
CPC ..... *G01R 33/1215* (2013.01); *G01R 33/0052* (2013.01); *G05B 19/401* (2013.01); *G05B 2219/37124* (2013.01)

(58) Field of Classification Search
CPC ............ G01R 33/1215; G01R 33/0052; G05B 19/401; G05B 2219/37124
See application file for complete search history.

(56) References Cited

U.S. PATENT DOCUMENTS

| 7,411,387 B2 | 8/2008 | Yamada |
| 2011/0025311 A1 | 2/2011 | Chauvin et al. |
| 2014/0176126 A1 | 6/2014 | Friedrich et al. |

OTHER PUBLICATIONS

English language translation of Written Opinion for PCT/EP2016/063319 (Year: 2017).*

(Continued)

*Primary Examiner* — Sujoy K Kundu
*Assistant Examiner* — L. Anderson
(74) *Attorney, Agent, or Firm* — B. Aaron Schulman, Esq.; Stites & Harbison, PLLC.

(57) ABSTRACT

The invention relates to a method for controlling the production of a magnet (12) using a sensor able to emit a presence signal for a magnetic induction and defining a measuring axis, the magnet (12) being a permanent magnet with symmetry of revolution, with its axis of revolution being a mechanical axis, the magnet (12) having a center and a maximum dimension, the method comprising:
a) performing a first measurement of a component of the magnetic induction produced by the magnet (12) using the sensor,
b) performing a second measurement of a component of the magnetic induction produced by the magnet (12) using the sensor, and
c) calculating the angular deviation of the equivalent magnetic moment of the magnet (12) from the first measurement and the second measurement.

10 Claims, 3 Drawing Sheets

(56) References Cited

OTHER PUBLICATIONS

International Search Report for PCT/EP2016/063319, dated Jul. 19, 2017.

* cited by examiner

METHOD FOR CONTROLLING THE PRODUCTION OF A MAGNET AND ASSOCIATED DEVICE

TECHNICAL FIELD OF THE INVENTION

The present invention relates to a method for controlling the production of a magnet with symmetry of revolution relative to an axis. The present invention also relates to the associated device.

BACKGROUND OF THE INVENTION

A permanent magnet, or magnet in everyday language, is an object manufactured from a hard magnetic material, i.e., the remnant field and coercive excitation of which are great. This gives the magnet particular properties related to the existence of the magnetic field, such as the ability to exert an attractive force on any ferromagnetic material.

Such properties make it possible to use the magnet in different application contexts. In particular, document EP 1,813,910 A2 describes a system for detecting the position of a vehicle using magnet characterization, while document US-2011/0025311 A1 relates to a system for characterizing a magnetic wheel.

However, the use of a magnet in such contexts assumes that the magnet respects given specifications.

In particular, it is desirable for the electromagnetic induction generated by the magnet to have the desired value to ensure that the magnet in question has the ability to exert a sufficient attractive force relative to the desired application.

Yet manufacturing a magnet is delicate, since for a magnet having the correct mechanical dimensions, the magnetic properties may vary considerably, and in particular, be outside acceptable allowance ranges. Such variations in particular come from the anisotropy of the materials used or the ability of the materials used to be magnetized.

There is therefore a need for a method for controlling the production of a magnet that is effective and easy to implement.

BRIEF DESCRIPTION OF THE INVENTION

To that end, proposed is a method for controlling the production of a magnet using a sensor able to emit a presence signal for a magnetic induction and defining a measuring axis, the magnet being a permanent magnet with symmetry of revolution relative to its axis, called mechanical axis, the magnet having a center and a maximum dimension, the method comprising at least the following step:
a) performing a first measurement of a component of the magnetic induction produced by the magnet using the sensor by implementing the following sub-steps:
a1) relative positioning of the magnet and the sensor so that the mechanical axis of the magnet and the measuring axis of the sensor are aligned with an allowance of 5 degrees, the distance between the sensor and the center of the magnet, called first distance, being greater than or equal to three times the maximum dimension of the magnet, and
a2) relative movement of the magnet and the sensor, along a direction perpendicular to the mechanical axis of the magnet, the first measurement corresponding to the maximum signal measured by the sensor during the movement,
b) performing a second measurement of a component of the magnetic induction produced by the magnet using the sensor by implementing the following sub-steps:
b1) positioning the sensor so that the measuring axis of the sensor is perpendicular to the mechanical axis of the magnet and is in a plane perpendicular to the mechanical axis of the magnet passing through a point of the magnet, the distance between the sensor and the center of the magnet, called second distance, being greater than or equal to three times the maximum dimension of the magnet,
b2) rotating the magnet relative to the mechanical axis by at least one revolution,
b3) measuring the maximum and minimum magnetic inductions during the rotation of the magnet in sub-step b2), the second measurement being obtained from maximum and minimum magnetic inductions, and
c) calculating the angular deviation of the equivalent magnetic moment of the magnet from the first measurement and the second measurement.

According to specific embodiments, the control method comprises one or more of the following features, considered alone or according to any technically possible combinations:
the first distance is greater than or equal to ten times the maximum dimension of the magnet.
the second distance is greater than or equal to ten times the maximum dimension of the magnet.
in step a1), the magnet and the sensor are relatively positioned such that the mechanical axis of the magnet is aligned with the measuring axis of the sensor.
in step b1), the magnet and the sensor are relatively positioned such that the mechanical axis of the magnet is perpendicular to the measuring axis of the sensor.
the second measurement is obtained by calculating the ratio between the difference in the maximum and minimum magnetic inductions obtained in sub-step b3) and the number 2.
step c) includes a sub-step c1) for applying the following formula:

$$\alpha = \tan^{-1}\frac{B_2}{B_1}$$

where:
$B_1$ is the value of the component obtained in step a),
$B_2$ is the value of the component obtained in step b),
$\alpha$ is the angular deviation of the equivalent moment relative to the vertical of the remnant induction of the magnet, and
$\tan^{-1}$ is the mathematical operation also called arctangent.
step c) includes a sub-step c2) for calculating the modulus of the equivalent moment of the magnet by applying the following formula:

$$m = \frac{4\pi r^3}{2\mu_0} * \sqrt{B_1^2}$$

where:
m is the modulus of the equivalent moment of the magnet, r is the mean arithmetic distance of the first distance and the second distance, and μ₀ is the magnetic permeability of the vacuum.

the method further includes a step d) for comparing the calculated angular deviation to a threshold value, the magnet being considered valid when the angular deviation is less than or equal to the threshold value.

The invention also relates to a device for controlling the production of a magnet, the magnet being a permanent magnet with symmetry of revolution relative to an axis, called mechanical axis, the magnet having a center and a maximum dimension, the device comprising:

a sensor able to emit a signal in the presence of a magnetic induction and defining a measuring axis, the sensor being able to take a first measurement of a component of the magnetic induction produced by the magnet and to take a second measurement of a component of the magnetic inductance produced by the magnet, a first member for relative positioning of the magnet and the sensor so that the mechanical axis of the magnet and the measuring axis of the sensor are aligned with an allowance of 5 degrees, the distance between the sensor and the center of the magnet, called first distance, being greater than or equal to three times the maximum dimension of the magnet, a first member for relative movement of the magnet and the sensor, along a direction perpendicular to the mechanical axis of the magnet, the first measurement corresponding to the maximum signal measured by the sensor during the movement, a second member for positioning the sensor so that the measuring axis of the sensor is perpendicular to the mechanical axis of the magnet and is in a plane perpendicular to the mechanical axis of the magnet passing through a point of the magnet, the distance between the sensor and the center of the magnet, called second distance, being greater than or equal to three times the maximum dimension of the magnet, a member for rotating the magnet relative to the mechanical axis by at least one revolution, a member for measuring the maximum and minimum magnetic inductions during the rotation of the magnet by the rotation member, a member for obtaining the second measurement from the maximum and minimum magnetic inductions, and a processing unit for calculating the angular deviation of the equivalent magnetic moment of the magnet from the first measurement and the second measurement.

According to specific embodiments, the control device comprises one or more of the following features, considered alone or according to any technically possible combinations:

the first distance is greater than or equal to ten times the maximum dimension of the magnet.

the second distance is greater than or equal to ten times the maximum dimension of the magnet.

BRIEF DESCRIPTION OF THE DRAWINGS

Other features and advantages of the invention will appear upon reading the following description of embodiments of the invention, solely as an example and done in reference to the drawings, which are.

DETAILED DESCRIPTION OF THE INVENTION

Detailed Description of One Example Embodiment

Figure 1:
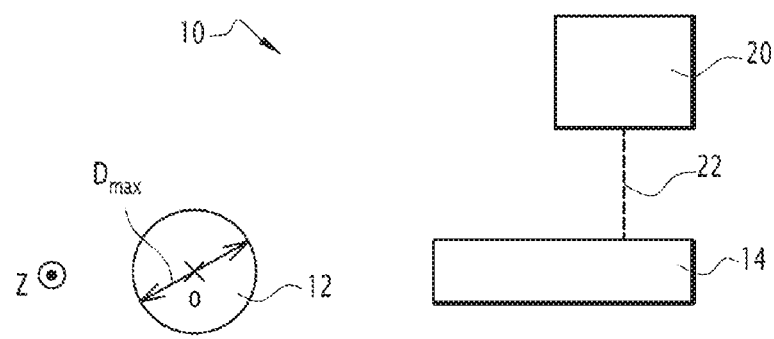
FIG. 1, a schematic illustration of an example device for controlling the production of a magnet, FIG. 2, a schematic illustration of a step of a method for controlling the production of a magnet, FIG. 3, a schematic illustration of another step of a method for controlling the production of a magnet, FIG. 4, a graph showing the effect of the induction of an angular deviation between the axis of the magnetic moment and the mechanical axis of a magnet based on this angular deviation, FIG. 5, a schematic illustration of the measuring positions for one example embodiment of a control method, FIG. 6, a schematic illustration of another example device for controlling the production of a magnet making it possible to carry out the control method of FIG. 5, and FIG. 7, a schematic illustration of the measuring positions for another example embodiment of a control method.

A device 10 for controlling the production of a magnet 12 is shown in FIG. 1.

The device 10 is able to characterize the properties of the magnet 12 and thus to determine whether the production quality of the magnet 12 is satisfactory.

The device 10 is able to carry out a method for controlling the production of the magnet 12, which should be understood as a method for characterizing the magnet 12.

According to the example of FIG. 1, the device 10 is a device making it possible to obtain the measurement of the equivalent magnetic moment M of the magnet 12. In this sense, the device 10 forms a characterization bench.

By definition, the equivalent magnetic moment of a magnet is the magnetic moment generating a magnetic induction having the same properties as the magnetic induction that the magnet is able to generate. The equivalent magnetic moment of a magnet is characterized by two properties, namely its intensity or modulus and its direction.

The magnet 12 is able to generate a magnetic induction at any point in space.

The magnet 12 is a permanent magnet.

Furthermore, the magnet 12 is a magnet with symmetry of revolution relative to an axis. The axis is called mechanical axis in the rest of the description and is denoted Z.

The magnet 12 is also polarized along a polarization axis. The polarization axis is denoted Pol hereinafter. The polarization axis Pol is in particular visible in FIG. 2.

It should be noted that the polarization axis Pol and the mechanical axis Z form an angle that corresponds to the angular deviation of the equivalent magnetic moment M at the magnet 12.

For example, as shown in FIG. 1, the magnet 12 is a cylindrical magnet with a circular base.

Furthermore, the magnet 12 is made from a homogeneous magnetic material. A magnetic material is considered to be homogeneous when the magnetic properties of the magnetic material do not depend on the location where the magnetic properties are evaluated.

The magnet 12 has a center denoted O.

For the rest of the description, a measuring plane $P_{measure}$ is defined. The measuring plane $P_{measure}$ is the plane perpendicular to the mechanical axis Z and passing through the center O of the magnet 12.

The magnet 12 has a maximum dimension $D_{max}$. By definition, the maximum dimension of a magnet is the largest Euclidean distance between two points of the magnet 12.

The device 10 includes a sensor 14 and a processing unit 20.

The sensor 14 is able to measure the magnetic induction existing in a given position. The sensor 14 is more specifically able to generate one signal or several signals proportional to the magnetic induction measured in a given position.

As an example, the sensor 14 generates a signal proportional to the amplitude of each component of the magnetic induction.

The processing unit 20 is also able to collect data from the sensor 14, as indicated by the first dotted lines 22.

More specifically, the processing unit 20 is able to collect the signals from each sensor 14 to deduce therefrom each component of the magnetic induction that the magnet 12 is able to generate.

The processing unit 20 is able to perform calculations from collected signals to deduce therefrom the equivalent magnetic moment M at the magnet 12, and in particular the direction of the equivalent magnetic moment, i.e., the angular deviation relative to the mechanical axis Z. Hereinafter, the angular deviation is denoted $\alpha$.

As an example, the processing unit 20 is a processor.

The operation of the device 10 visible in FIG. 1 will now be described in reference to an example embodiment of a method for controlling the production of the magnet 12.

For example, the control method comprises three successive steps: a step a) for taking a first measurement, a step b) for taking a second measurement, and a step c) for calculating the angular deviation $\alpha$ of the equivalent magnetic moment M at the magnet 12.

Other orders can also be considered. In particular, step a) for taking a first measurement and step b) for taking a second measurement are interchangeable.

In step a) for taking the first measurement, the component produced by the magnet 12 in a first position P1 is measured.

The first position P1 belongs to the measuring plane $P_{measure}$.

Step a) for taking the first measurement includes two sub-steps: a first sub-step a1) for relative positioning and a second sub-step a2) for relative movement.

The first sub-step a1) is for example carried out by a first positioning member.

In the sub-step a1) for relative positioning, the magnet 12 and the sensor 14 are positioned relative to one another so that the mechanical axis Z of the magnet 12 is aligned with an allowance of within 5 degrees.

Furthermore, the distance OP1 between the sensor 14 and the center O of the magnet 12, called first distance, is greater than or equal to ten times the maximum dimension $D_{max}$ of the magnet 12.

Mathematically, this is written OP1$\geq 10*D_{max}$ where '*' designates the mathematical operation of multiplication.

Preferably, the distance OP1 between the first position P1 and the center O of the magnet 12 is less than or equal to twenty times the maximum dimension $D_{max}$ of the magnet 12. This is written mathematically as OP1$\leq 20*D_{max}$.

Advantageously, the distance OP1 between the first position P1 and the center O of the magnet 12 is equal to fifteen times the maximum dimension $D_{max}$ of the magnet 12. This is written mathematically as OP1$\leq 15*D_{max}$. The value of $15*D_{max}$ corresponds to a compromise between good validity of the dipolar approximation, on the one hand, and easy implementation of the measurement, on the other hand.

The sub-step a1) is in particular carried out by a first positioning member.

During sub-step a2), the magnet 12 and the sensor 14 undergo relative movement along a direction perpendicular to the mechanical axis Z of the magnet 12. Such movement is shown schematically in FIG. 2, in which an arrow is indicated dep.

The first measurement B1 corresponds to the maximum signal measured by the sensor 14 during the movement.

The sub-step a2) is in particular carried out by a first movement member.

Step a) for taking the first measurement is carried out using the sensor 14 and allows the first measurement of the magnetic induction. The first measurement of the magnetic induction is denoted B1.

In the step for taking the second measurement, the component produced by the magnet 12 in a second position P2 is measured.

The second position P2 belongs to the measuring plane $P_{measure}$.

The step b) for taking the second measurement includes three sub-steps: a first sub-step b1) for positioning, a second sub-step b2) for rotation and a third sub-step b3) for measuring.

In the first sub-step b1) the sensor is positioned so that the measuring axis of the sensor is perpendicular to the mechanical axis of the magnet and is in a plane perpendicular to the mechanical axis of the magnet passing through a point of the magnet.

Furthermore, the distance OP2 between the second position P2 and the center O of the magnet 12 is greater than or equal to ten times the maximum dimension $D_{max}$ of the magnet 12. This is written mathematically as OP2$\geq 10*D_{max}$ Preferably, the distance OP2 between the second position P2 and the center O of the magnet 12 is less than or equal to twenty times the maximum dimension $D_{max}$ of the magnet 12. This is written mathematically as OP2$\leq 20*D_{max}$.

Advantageously, the distance OP2 between the second position P2 and the center O of 12 is equal to fifteen times the maximum dimension $D_{max}$ of the magnet 12. This is written mathematically as OP2$=15*D_{max}$. The value of $15*D_{max}$ corresponds to a compromise between good validity of the dipolar approximation, on the one hand, and easy implementation of the measurement, on the other hand.

The first sub-step b1) is carried out by a second positioning member.

Figure 3:
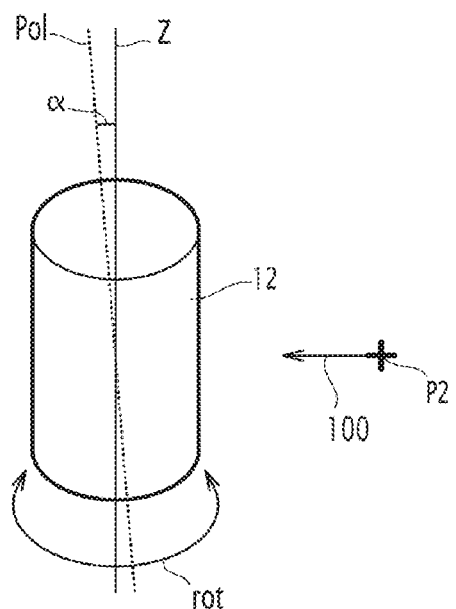

During the second sub-step b2), the magnet 12 is rotated relative to the mechanical axis by at least one revolution as illustrated schematically in FIG. 3.

For example, the second sub-step b2) is carried out using a member for rotating the magnet 12.

During the third sub-step b3), the maximum and minimum magnetic inductions are measured during the rotation of the magnet 12 in sub-step b2), the second measurement B2 being obtained from maximum and minimum magnetic inductions.

The third sub-step b3) is carried out for example by using a measuring member and an obtaining member.

The second measuring step is carried out using the sensor 14, which makes it possible to obtain the value of the component of the magnetic induction produced by the magnet 12 in the second position P2.

At the end of the second measuring step, a second measurement of the magnetic induction is obtained. The second measurement of the magnetic induction is denoted B2.

Step c) for calculating the angular deviation $\alpha$ of the equivalent magnetic moment M of the magnet 12 is carried out by the processing unit 20 from the first measurement B1 and the second measurement B2.

To that end, the magnetic induction of the magnet 12 is likened to a magnetic dipole, the magnetic moment of which is the equivalent magnetic moment M of the magnet 12. By using the dipolar approximation, it is possible to deduce, from two separate induction measurements, the modulus of the equivalent magnetic moment as well as the direction of the equivalent magnetic moment, i.e., the angular deviation α relative to the mechanical axis Z.

The control method therefore makes it possible to obtain the equivalent magnetic moment M of the magnet 12 both in amplitude and direction.

The control method is easy to implement, since only two measurements of the magnetic induction of the magnet 12 are involved.

Furthermore, the control method is a robust method making it possible to obtain good precision in the measurement of the angular deviation α of the equivalent magnetic moment M of a magnet 12.

According to one embodiment, the measurement of the angular deviation α of the magnetic moment M is used as an indicator of the production quality of the magnet 12.

Indeed, it is possible to quantify the effect on the magnetic induction produced by the magnet 12 from the value of the angular deviation α. The graph of FIG. 4 illustrates such a quantification, since the variation of the normalized magnetic induction value is shown as a function of the angular deviation value.

Figure 4:
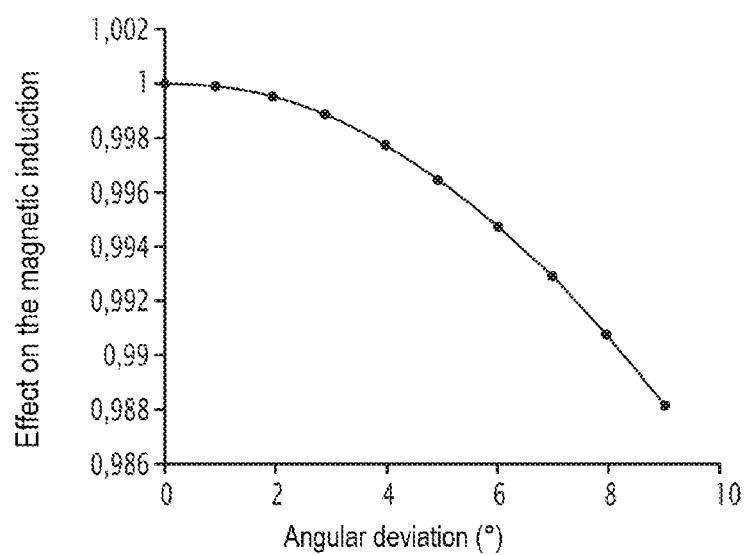

Upon examining FIG. 4, it appears that an angular deviation value of 8° results in an estimate of the magnetic moment M that is distorted by 1%. This therefore appears to indicate that the alignment constraints (for step a) for taking a first measurement impose an alignment of no more than 8% to obtain good precision.

Consequently, in one particular example, the method further includes a step d) for comparing the calculated angular deviation to a threshold value, the magnet 12 being considered valid when the angular deviation is less than or equal to the threshold value.

As explained in light of FIG. 4, it is advantageous to propose a threshold value of plus or minus 8°.

Detailed Description of One Particular Example Embodiment

Figure 5:
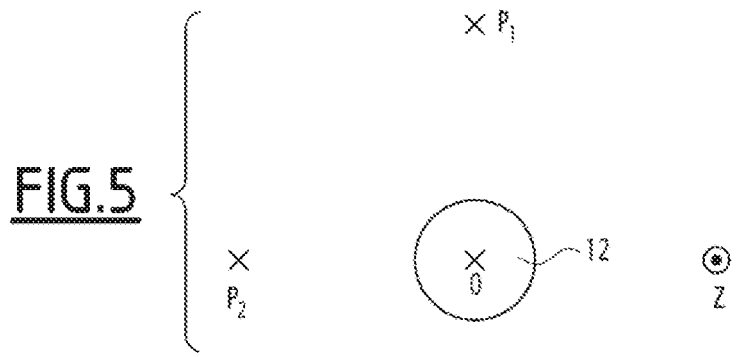

According to the embodiment illustrated by FIG. 5, the second position P2 is separate from the first position P1.

Furthermore, the distance OP1 between the first position P1 and the geometric center O of the magnet 12 and the distance OP2 between the second position P2 and the geometric center O of the magnet 12 are equal to plus or minus 1%.

Advantageously, as is the case in FIG. 5, the distance OP1 between the first position P1 and the geometric center O of the magnet 12 and the distance OP2 between the second position P2 and the geometric center O of the magnet 12 are equal. This is written mathematically as OP1=OP2.

Figure 6:
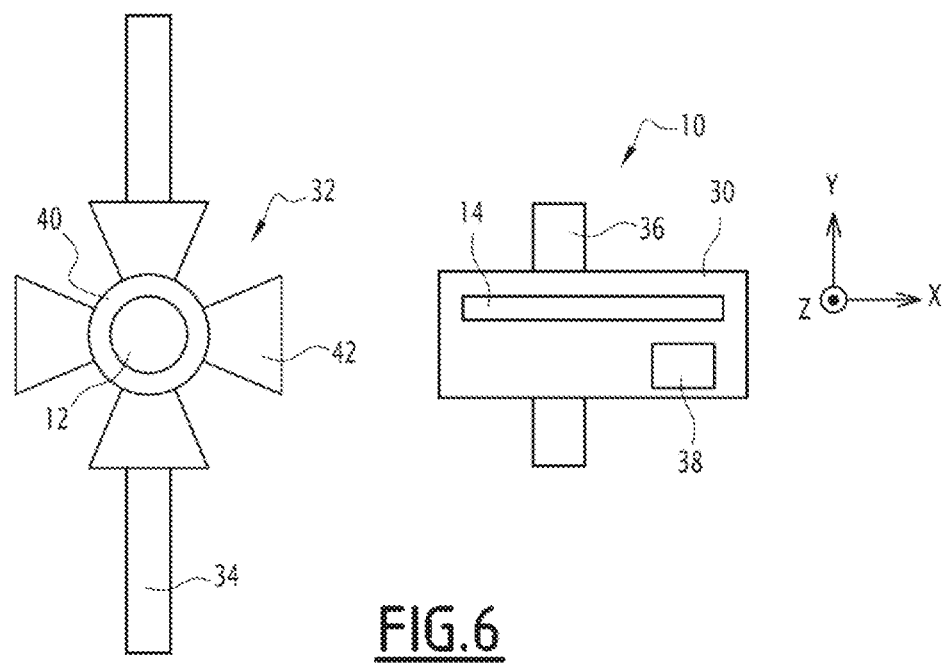
Figure 7:
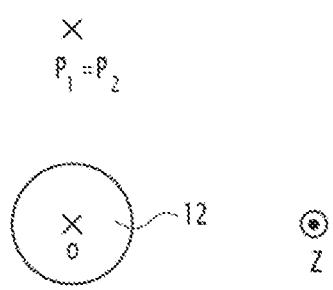

Such a method has the advantage of being easy to carry out, in particular by the device 10 as illustrated in FIG. 6.

The device 10 of FIG. 6 comprises the same elements as the device 10 of FIG. 1.

Furthermore, the device 10 of FIG. 6 includes a magnetometer 30 comprising the sensor 14, a first support 32 intended to support the magnet 12, a guide member 34 of the first support 32 and a second support 36 intended to support the sensor 14.

The magnetometer 30 includes the sensor 14 and an electronic unit 38.

The magnetometer 30 is an apparatus used to measure the magnetic induction or the magnetization of a device. The magnetometer 30 rests on an element sensitive to magnetic induction, which, in the case at hand, is the magnetic induction sensor 14 that, associated with the electronic unit 38, makes it possible to extract the measurement of the magnetic induction. Different types exist, based on different physics principles.

According to the example of FIG. 6, the magnetometer 30 is a fluxgate magnetometer.

Advantageously, as is the case for the example of FIG. 6, the magnetometer 30 is a uniaxial vectoral magnetometer.

The expression "uniaxial vectoral magnetometer" means that the magnetometer is able to provide a component of the magnetic induction. More specifically, the uniaxial sensor measures the value of the component of the magnetic induction parallel to the axis of the sensor 14.

Consequently, for the magnetometer 30, a measuring axis is defined hereinafter that is called "axis of the sensor 14". The axis of the sensor 14 is symbolized by an axis X in FIG. 6.

The first support 32 is able, according to the example of FIG. 6, to rotate around the mechanical axis Z.

According to the example of FIG. 6, the first support 32 includes a receiving base 40 and branches 42.

The base 40 is able to receive the magnet 12.

As shown in FIG. 6, the base 40 is in the shape of a cylinder with a disc-shaped base.

The branches 42 extend radially from the base 40.

In the case of FIG. 6, there are four branches 42, in opposite pairs and extending radially from the base 40. In a section in parallel with the measuring plane $P_{measure}$, the first support 32 is in the form of a Maltese cross. In other words, the span of the branches 42 decreases toward the base 40.

Other forms for the base 40 can also be considered.

The first support 32 is made from a nonmagnetic material.

The first support 32 is preferably obtained using a three-dimensional printing method.

The guide member 34 is able to allow a translational movement of the first support 32 and to allow the first support 32 to rotate around itself.

The guide member 34 is an optical rail. The rail 34 is made from aluminum, which makes it possible to obtain a nonmagnetic device 10.

In the particular case of FIG. 6, the rail 34 is in the form of an X-shaped profile.

The rail 34 extends primarily along a direction perpendicular to the axis of the sensor 14. The associated direction is called direction of the rail 34 in the continuation of the description and is symbolized by an axis Y in FIG. 6.

According to the example of FIG. 6, the second support 36 is fixed.

According to one embodiment, the second support 36 rotates around the mechanical axis Z, while the first support 32 is fixed.

According to still another embodiment, both supports 32 and 36 are able to rotate around the mechanical axis Z.

The operation of the device of FIG. 6 will now be described in reference to an example embodiment of a method for controlling the production of the magnet 12.

In such an example, the control method comprises four successive steps: a step for taking the ambient magnetic induction into account, a first measuring step, a second measuring step, and a step for calculating the angular deviation α of the magnetic moment M.

In the step for taking account of the ambient magnetic induction, the magnetometer 30 is positioned in the second support 36 in the operating position. The magnetometer 30 measures a non-zero ambient magnetic induction. The magnetometer 30 then compensates for the ambient magnetic induction using an offset function, such that the magnetometer 30 measures a zero magnetic induction even in the presence of the ambient magnetic induction.

Alternatively, the magnetometer 30 is positioned in the second support 36 in the operating position. In practice, the measurement from the sensor 14 is not necessarily zero, since the ambient magnetic induction, which is a vector, is projected on the measuring axis of the sensor 14. However, there are two positions for which the projection of the ambient magnetic induction is equal to zero. The two positions are in the same and opposite directions. In order to converge toward the two positions, the entire device 10 is rotated around the mechanical axis Z until it reaches one of the two positions.

According to another embodiment, the device 10 is first rotated around the mechanical axis Z until reaching one of the two positions, then the magnetometer 30 compensates for the residual ambient magnetic induction. In such an embodiment, a rough adjustment is followed by a fine adjustment, which makes it possible to obtain a fine compensation of the ambient magnetic induction.

The step for taking account of the ambient magnetic induction makes it possible, during the implementation of the measuring steps, for the magnetometer 30 to measure only the contribution of the magnet 12 to the magnetic induction.

The remarks relative to the first measuring step as previously described also apply to the present first measuring step.

Furthermore, in the particular case of the device 10 of FIG. 6, the magnet 12 is arranged in a first particular position called the first Gauss position G1. During the first measuring step, the magnet 12 is moved from one end to the other of the guide member 34 and the magnetic induction is measured simultaneously by the sensor 14. The maximum of the read measurement yields the value of the magnetic induction generated by the magnet 12 in the first Gauss position G1.

Thus, during the first measuring step, the signal measured by the sensor 14 is maximal when the magnet 12 is parallel to the sensor 14.

The remarks relative to the second measuring step as previously described also apply to the present second measuring step.

The second position P2 is the second Gauss position G2.

To obtain the value of the magnetic induction generated by the magnet 12 in the second Gauss position G2, two magnetic induction values are measured. While the magnet 12 is rotated around the mechanical axis Z, the maximum value $B_{max}$ assumed by the magnetic induction as well as the maximum value $B_{min}$ assumed by the magnetic induction are read. The value of the magnetic induction generated by the magnet 12 in the second Gauss position G2 is obtained by calculating the difference between the maximum value and the minimum field value divided by two. This is written mathematically as:

$$B_2 = \frac{1}{2}(B_{max} - B_{min})$$

In the step for calculating the angular deviation α of the equivalent magnetic moment from the first measurement B1 and the second measurement B2, the angular deviation of the equivalent moment relative to the vertical of the remanent induction of the magnet 12 is given by the following formula:

$$\alpha = \tan^{-1}\frac{B_2}{B_1}$$

Where:
α is the angular deviation of the equivalent moment relative to the vertical of the remanent induction of the magnet 12, and
$\tan^{-1}$ is the mathematical operation also called arctangent.

The previous formula is simplified when the ratio B2/B1 is low, which is usually the case in practice according to the following approximated form:

$$\alpha = \frac{B_2}{B_1}$$

The step for calculating the magnetic moment then comprises calculating the modulus of the equivalent magnetic moment by applying the following formula:

$$m = \frac{4\pi r^3}{2\mu_0} * \sqrt{B_1^2}$$

Where:
m is the modulus of the equivalent moment of the magnet 12,
r is the mean arithmetic distance of OP1 and OP2, and
$\mu_0$ is the magnetic permeability of the vacuum.

It should be noted that preferably, the equality OP1=OP2 is verified.

Indeed, it should be noted that an error of 1% on the distance (i.e., OP1=99%*OP2 or OP1=101%*OP2) causes an error of 3% on the estimate of the magnetic properties. An error of 2% on the distance would likewise cause an error of 6% on the estimate of the magnetic properties. As a result, it is desirable to reproduce the distances without bias in order for the measurement to be reliable.

The control method therefore makes it possible to obtain the equivalent magnetic moment of the magnet 12 both in amplitude and direction.

The control method is easy to implement, since only two measurements of the magnetic induction of the magnet 12 are involved.

Furthermore, the control method is a robust method making it possible to obtain good precision in the measurement of the angular deviation α of the equivalent magnetic moment of a magnet 12.

The method for controlling the production of a magnet 12 is thus a method for characterizing a magnet 12.

It should be noted that the control method also works for a first distance OP1 greater than or equal to three times the maximum dimension $D_{max}$ of the magnet 12. With this factor 3, a good approximation of the angular deviation is obtained. The case where the factor is 10 makes it possible to improve the precision.

Similarly, the control method also works for a second distance OP2 greater than or equal to three times the maximum dimension $D_{max}$ of the magnet 12. With this factor 3, a good approximation of the angular deviation is obtained. The case where the factor is 10 makes it possible to improve the precision.

The method also works for the combination of the two above conditions, i.e., a first distance OP1 greater than or equal to three times the maximum dimension $D_{max}$ of the magnet 12 and a second distance OP2 greater than or equal to three times the maximum dimension $D_{max}$ of the magnet 12.

Experimental Results

Figure 2:
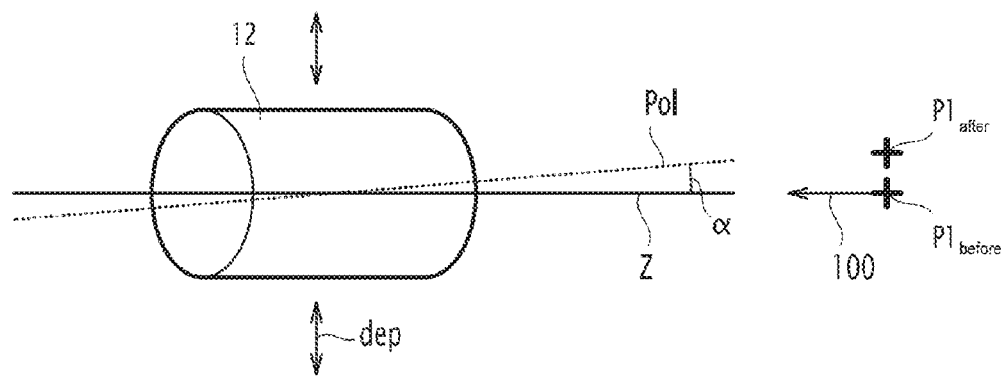

An experiment has been conducted and has shown that the method illustrated in reference to FIG. 2 makes it possible to obtain good measurement results.

A prototype applying the results previously described has been built. We used an axial sensor of the FluxGate Frster Magnetoscop type.

The applicant conducted a series of blind measurements on a batch of magnets provided by a supplier. The measurements are shown below and illustrate the validity of the control method. It appears that the obtained measurements match the data provided by the supplier.

Table 1 shows the measurements for the N52-type magnets. The first two angle values correspond to the measurements done by two suppliers, denoted supplier 1 and supplier 2. The measurements obtained by implementing the method are added: i.e., the measurement of the magnetic moment, then the measurement of the deviation angle. It should be noted that the two angle measurements were systematically done so as to have an estimator of the dispersion of the angular measurements.

TABLE 1

Results on N52-type magnets

| Magnet number | Angle (°) Supplier 1 | Angle (°) Supplier 2 | Magnetic moment (A · m$^2$) | Angle (°) 1 Applicant | Angle (°) 2 Applicant |
|---|---|---|---|---|---|
| N52/1 | 0.30 | 0.26 | 0.198 | 0.36 | 0.42 |
| N52/2 | 0.38 | 0.42 | 0.200 | 0.32 | 0.38 |
| N52/3 | 1.71 | 1.68 | 0.197 | 1.79 | 1.79 |
| N52/4 | 0.56 | 0.77 | 0.194 | 0.63 | 0.70 |
| N52/5 | 1.01 | 0.88 | 0.198 | 1.01 | 1.01 |
| N52/6 | 0.55 | 0.47 | 0.199 | 0.42 | 0.50 |
| N52/7 | 0.19 | 0.15 | 0.198 | 0.12 | 0.18 |
| N52/8 | 2.31 | 2.12 | 0.197 | 2.11 | 2.11 |
| N52/9 | 2.36 | 2.46 | 0.169 | 2.52 | 2.52 |
| N52/10 | 1.19 | 1.14 | 0.198 | 1.22 | 1.25 |
| N52/11 | 1.52 | 1.48 | 0.198 | 1.50 | 1.56 |
| N52/12 | 0.16 | 0.11 | 0.197 | 0.12 | 0.06 |
| N52/13 | 0.37 | 0.23 | 0.199 | 0.12 | 0.18 |
| N52/14 | 0.94 | 0.92 | 0.197 | 0.95 | 1.01 |
| N52/16 | 1.19 | 1.03 | 0.196 | 1.02 | 0.99 |
| N52/17 | 1.32 | 1.22 | 0.170 | 1.24 | 1.24 |
| N52/18 | 2.02 | 1.95 | 0.198 | 1.96 | 1.90 |
| N52/19 | 0.50 | 0.72 | 0.197 | 0.71 | 0.77 |
| N52/20 | 0.96 | 1.24 | 0.197 | 1.31 | 1.31 |
| N52/21 | Unknown | Unknown | 0.198 | 0.65 | 0.59 |

It should be noted that the method showed two magnets for which the grades had been incorrectly measured. These are magnets nos. 9 and 17, the magnetic moment of which is that of a N35-type magnet.

The deviation between the two measurements by the applicant is no more than 0.08°. The measurements by the applicant approach the measurements previously done, the dispersion of which appears higher.

An identical tendency was observed for the results of the N35-type magnets (see table 2). The dispersions of the angles measured by the applicant are no more than 0.1°, i.e., a value close to that previously obtained on the N52-type magnets.

Particular attention is given to magnets nos. 5 and 16, for which the angles proposed by the supplier do not match the angles measured by the applicant. After examination, it appears that the two magnets were in all likelihood switched. The angles obtained by the applicant for magnet 16 clearly correspond to the supplier angles for magnet 5, and vice versa. This experiment reinforces the reliability of the proposed measuring protocol.

TABLE 2

Experimental results on N35-type magnets

| Magnet number | Angle (°) Supplier 1 | Angle (°) Supplier 2 | Magnetic moment (A · m$^2$) | Angle (°) 1 Applicant | Angle (°) 2 Applicant |
|---|---|---|---|---|---|
| N35/1 | 0.78 | 1.10 | 0.170 | 0.96 | 1.03 |
| N35/2 | 0.48 | 0.51 | 0.171 | 0.41 | 0.41 |
| N35/3 | 1.18 | 1.13 | 0.169 | 1.15 | 1.25 |
| N35/4 | 1.67 | 1.88 | 0.169 | 1.73 | 1.80 |
| N35/5 | 1.85 | 1.79 | 0.169 | 0.38 | 0.38 |
| N35/7 | 0.27 | 0.24 | 0.170 | 0.21 | 0.28 |
| N35/8 | 0.85 | 0.92 | 0.167 | 0.98 | 1.05 |
| N35/9 | 1.39 | 1.33 | 0.169 | 1.25 | 1.32 |
| N35/14 | 0.23 | 0.25 | 0.170 | 0.14 | 0.24 |
| N35/16 | 0.55 | 0.45 | 0.167 | 1.75 | 1.82 |
| N35/17 | 0.30 | 0.31 | 0.169 | 0.28 | 0.35 |
| N35/19 | 0.62 | 0.62 | 0.168 | 0.49 | 0.56 |

It should be recalled that the previous measurements were done blind, i.e., without an a priori idea of the result to be obtained.

CONCLUSIONS

According to one embodiment, a first measuring direction D1 is defined as the direction connecting the first position P1 to the geometric center of the magnet 12, and a second measuring direction D2 as the direction connecting the second position P2 to the geometric center of the magnet 12. The first measuring direction D1 and the second measuring direction D2 form an angle β, called measuring angle. The measuring angle β is comprised between 85° and 95°.

Preferably, the measuring angle β is equal to 90°.

This makes it possible to simplify the formulas used in the calculating step, which makes the control method easier to carry out.

Generally, the control method applies to any type of permanent magnet 12 with symmetry of revolution relative to the mechanical axis Z. In particular, it is interesting to apply the method to a magnet 12 having a cylindrical central hollow allowing the insertion of a pencil.

The invention claimed is:

1. A method for controlling the production of a magnet using a sensor able to emit a signal in the presence of a magnetic induction and defining a measuring axis, the magnet being a permanent magnet with symmetry of revolution, with its axis of revolution being a mechanical axis, the magnet having a center and a maximum dimension, the method comprising:

a) performing a first measurement of a component of the magnetic induction produced by the magnet using the sensor by implementing a1 and a2 as follows:

a1) relative positioning of the magnet and the sensor so that the mechanical axis of the magnet and the measuring axis of the sensor are aligned with an allowance of 5 degrees, the distance between the sensor and the center of the magnet, called first distance, being greater than or equal to three times the maximum dimension of the magnet, and a2) relative movement of the magnet and the sensor, along a direction perpendicular to the mechanical axis of the magnet, the first measurement corresponding to the maximum signal measured by the sensor during the movement, b) performing a second measurement of a component of the magnetic induction produced by the magnet using the sensor by implementing b1, b2, and b3 as follows:

b1) positioning the sensor so that the measuring axis of the sensor is perpendicular to the mechanical axis of the magnet and is in a plane perpendicular to the mechanical axis of the magnet passing through a point of the magnet, the distance between the sensor and the center of the magnet, called second distance, being greater than or equal to three times the maximum dimension of the magnet, b2) rotating the magnet relative to the mechanical axis by at least one revolution, and b3) measuring the maximum and minimum magnetic inductions during the rotation of the magnet in b2), the second measurement being obtained from maximum and minimum magnetic inductions, and c) calculating the angular deviation of the equivalent magnetic moment of the magnet from the first measurement and the second measurement wherein the maximum dimension of the magnet is the largest Euclidean distance between two points of the magnet.

2. The method according to claim 1, wherein the first distance is greater than or equal to ten times the maximum dimension of the magnet.

3. The method according to claim 1, wherein the second distance is greater than or equal to ten times the maximum dimension of the magnet.

4. The method according to claim 1 wherein in a1), the magnet and the sensor are relatively positioned such that the mechanical axis of the magnet is aligned with the measuring axis of the sensor.

5. The method according to claim 1, wherein in b1), the magnet and the sensor are relatively positioned such that the mechanical axis of the magnet is perpendicular to the measuring axis of the sensor.

6. The method according to claim 1, wherein the second measurement is obtained by calculating the ratio between the difference in the maximum and minimum magnetic inductions obtained in b3) and the number 2.

7. The method according to claim 1, wherein c) further comprises applying the following formula:

$$\alpha = \tan^{-1}\frac{B_2}{B_1}$$

where:
$B_1$ is the value of the component obtained in a),
$B_2$ is the value of the component obtained in b),
$\alpha$ is the angular deviation of the equivalent moment relative to the vertical of the remanent induction of the magnet, and
$\tan^{-1}$ is the mathematical operation also called arctangent.

8. The method according to claim 1, wherein c) further comprises calculating the modulus of the equivalent moment of the magnet by applying the following formula:

$$m = \frac{4\pi r^3}{2*\mu_0} * \sqrt{B_1^2}$$

where:
m is the modulus of the equivalent moment of the magnet,
r is the mean arithmetic distance of the first distance and the second distance, and
$\mu_0$ is the magnetic permeability of the vacuum.

9. The method according to claim 1, wherein the method further comprises comparing the calculated angular deviation to a threshold value, the magnet being considered valid when the angular deviation is less than or equal to the threshold value.

10. A device for controlling the production of a magnet, the magnet being a permanent magnet with symmetry of revolution, with its axis of revolution being a mechanical axis, the magnet having a center and a maximum dimension, the device comprising:

a sensor able to emit a signal in the presence of a magnetic induction and defining a measuring axis, the sensor being able to take a first measurement of a component of the magnetic induction produced by the magnet and to take a second measurement of a component of the magnetic inductance produced by the magnet, a first member for relative positioning of the magnet and the sensor so that the mechanical axis of the magnet and the measuring axis of the sensor are aligned with an allowance of 5 degrees, the distance between the sensor and the center of the magnet, called first distance, being greater than or equal to three times the maximum dimension of the magnet, a first member for relative movement of the magnet and the sensor, along a direction perpendicular to the mechanical axis of the magnet, the first measurement corresponding to the maximum signal measured by the sensor during the movement, a second member for positioning the sensor so that the measuring axis of the sensor is perpendicular to the mechanical axis of the magnet and is in a plane perpendicular to the mechanical axis of the magnet passing through a point of the magnet, the distance between the sensor and the center of the magnet, called second distance, being greater than or equal to three times the maximum dimension of the magnet, a member for rotating the magnet relative to the mechanical axis by at least one revolution, a member for measuring the maximum and minimum magnetic inductions during the rotation of the magnet by the rotation member, a member for obtaining the second measurement from the maximum and minimum magnetic inductions, and a processing unit for calculating the angular deviation of the equivalent magnetic moment of the magnet from the first measurement and the second measurement wherein the maximum dimension of the magnet is the largest Euclidean distance between two points of the magnet.

* * * * *